United States Patent
Yeh et al.

(10) Patent No.: US 8,080,461 B2
(45) Date of Patent: Dec. 20, 2011

(54) METHOD OF MAKING A THIN FILM RESISTOR

(75) Inventors: Der-Chyang Yeh, Hsin-Chu (TW);
Hsun-Chung Kuang, Yang-Mei (TW);
Ming Chyi Liu, Hsinchu (TW);
Chung-Yi Yu, Hsin-Chu (TW);
Chih-Ping Chao, Hsin-Chu (TW);
Alexander Kalnitsky, San Francisco, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 101 days.

(21) Appl. No.: 12/688,083

(22) Filed: Jan. 15, 2010

(65) Prior Publication Data
US 2011/0177668 A1    Jul. 21, 2011

(51) Int. Cl.
*H01L 21/20* (2006.01)
*H01L 21/4763* (2006.01)

(52) U.S. Cl. ........ 438/384; 438/381; 438/382; 438/385; 438/620; 257/E21.004; 257/E21.006; 257/E21.003; 257/E21.495

(58) Field of Classification Search ........... 257/E21.003, 257/E21.004, E21.006, E21.495
See application file for complete search history.

(56) References Cited

U.S. PATENT DOCUMENTS

| 7,345,573 B2 | 3/2008 | Beach | |
|---|---|---|---|
| 2001/0046771 A1* | 11/2001 | Steinmann et al. | 438/689 |
| 2007/0008062 A1* | 1/2007 | Fivas et al. | 338/25 |
| 2007/0048960 A1* | 3/2007 | Jaiswal et al. | 438/383 |
| 2008/0132056 A1* | 6/2008 | Beach | 438/620 |

* cited by examiner

*Primary Examiner* — Mohsen Ahmadi
(74) *Attorney, Agent, or Firm* — Duane Morris LLP; Steven E. Koffs

(57) ABSTRACT

A method of making a thin film resistor includes: forming a doped region in a semiconductor substrate; forming a dielectric layer over the substrate; forming a thin film resistor over the dielectric layer; forming a contact hole in the dielectric layer before annealing the thin film resistor, wherein the contact hole exposes a portion of the doped region; and performing rapid thermal annealing on the thin film resistor after forming the contact hole.

17 Claims, 10 Drawing Sheets

METHOD OF MAKING A THIN FILM RESISTOR

FIELD OF THE INVENTION

The present disclosure relates to semiconductor fabrication generally, and more specifically to methods for making thin film resistors in integrated circuits.

BACKGROUND

Design engineers include thin film resistors (TFR) in integrated circuit (IC) designs. Parameters that are controlled during the design stage include the sheet resistance of the TFR and the temperature coefficient of resistance (TCR), which characterizes the change in sheet resistance per unit change in temperature.

Controlling the sheet resistances and TCRs of TFRs on different layers of an IC is complicated, because temperature processing of a subsequently deposited layer can affect the sheet resistance and TCR of a previously deposited layer.

Improved TFR integration methods are desired

SUMMARY OF THE INVENTION

In some embodiments, a method of making a thin film resistor includes: forming a doped region in a semiconductor substrate; forming a dielectric layer over the substrate; forming a thin film resistor over the dielectric layer; forming a contact hole in the dielectric layer, such that the contact hole exposes the doped region; forming a conductive liner on a sidewall of the contact hole; and performing a rapid thermal annealing on the thin film resistor and the conductive liner simultaneously.

In some embodiments, a method of making a thin film resistor includes forming a doped region in a semiconductor substrate; forming a dielectric layer over the substrate; forming a thin film resistor over the dielectric layer; forming a contact hole in the dielectric layer, wherein the contact hole exposes a portion of the doped region; and performing rapid thermal annealing to the thin film resistor after forming the contact hole.

DETAILED DESCRIPTION

Figure 1A:
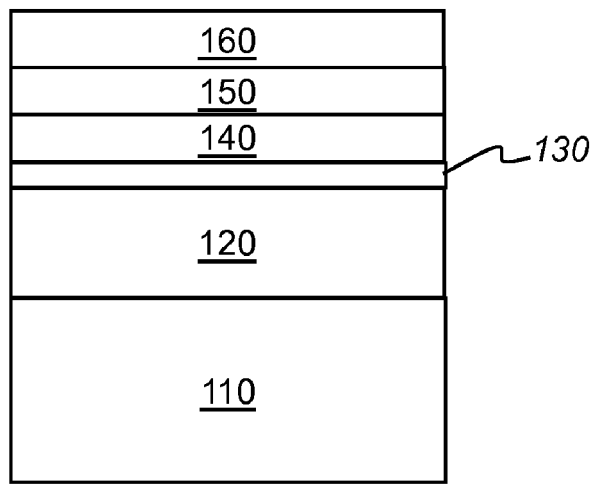
FIGS. 1A-1I show an example of a method for forming an IC including at least one TFR.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

FIGS. 1A-1I show a first example of an integration method, which includes making a thin film resistor 142 in an IC 100. The example of FIGS. 1A-1I includes using a single thermal treatment (annealing step) to adjust the parameters (TCR and sheet resistance) of a TFR and anneal a contact liner (barrier) layer.

FIG. 1A shows a plurality of layers formed sequentially on a semiconductor substrate 110. The substrate 110 may be, for example, a silicon substrate, a III-V compound substrate, a glass substrate with a semiconductor layer thereon, a liquid crystal display (LCD) substrate or the like. The substrate 110 has a plurality of devices (e.g., transistors, capacitors) formed at its surface. A doped region 112 (shown in FIGS. 1E-1I) is formed in the semiconductor substrate 110.

In this example, a first layer 120 of inter-level dielectric (ILD) material, also known as an interlayer dielectric or inter-metal dielectric (IMD), is formed over the substrate 110. The materials of the ILD layers are selected to minimize size, propagation delays, and crosstalk between nearby lines. The ILD layer 120 may be formed of an oxide layer, such as $SiO_2$. In advanced technologies having smaller critical dimensions, a variety of ILD materials may be used, such as medium k dielectric materials, low-k dielectric materials having k less than 3.5, or ELK dielectric materials having a dielectric constant k less than 3.0. For example, ILD materials such as undoped silica glass (USG), phosphor doped silicate glass (PSG), fluorine doped silicate glass (FSG), a boron doped silicate glass (BSG) layer, or a boron phosphorous doped silicate glass (BPSG) layer may be used. In other embodiments, the material in the ILD layer 120 may be porous or non-porous carbon doped silicon dioxide, such as "BLACK DIAMOND™" or "BLACK DIAMOND II™" carbon doped silicon dioxide, sold by Applied Materials, Inc., of Santa Clara, Calif., or "AURORA™", "AURORA 2.7™" or "AURORA ULK™" carbon doped silicon dioxide from ASM International N.V., of Almere, Netherlands.

The ILD 120 may be part of an interconnect structure having a plurality of dielectric layers containing trenches and vias that are filled with conductive material (e.g., copper) for forming connections within and between layers, respectively. Interconnect layer 120 may be formed by damascene processes, including depositing the dielectric material, forming and filling the trenches and vias, and planarizing the ILD layer.

The ILD layer 120 is capped with a high quality, low impurity oxide layer 130, formed by chemical vapor deposition (CVD). For example, oxide layer 130 may be formed from silane by a plasma enhanced CVD (PECVD) process. Silicon dioxide can be deposited from dichlorosilane or silane and oxygen, for example, at pressures from a few hundred milliTorr to a few Torr. High-density plasma deposition of silicon dioxide from silane and oxygen/argon can be used to form a nearly hydrogen-free film. In addition, such a PECVD film provides good conformality over non-planar surfaces, as shown in FIGS. 1E-1H. The ability to form conformal coatings is provided by intense ion bombardment which sputters the deposited molecules from vertical surfaces onto horizontal surfaces.

A layer 140 of resistor material is formed over the oxide layer 130. In some embodiments, the resistor material is sichrome (SiCr) with a layer thickness of about 200 angstroms or less. In other embodiments, the resistor material layer 140 may be formed of other film resistor materials such as: nickel chrome (Ni—Cr), tantalum (Ta), Cr—SiO, or $Cr_xSi_yN_z$.

A cap layer 150 is formed over the resistive film layer 140. The cap layer 150 may be, for example, titanium nitride (TiN), tantalum nitride (TaN), TiW, or TaW. In some embodiments, the cap layer 150 has a thickness from about 100 angstroms to about 1000 angstroms. The cap layer 150 prevents oxidation and provides a glue layer for the subsequently deposited contact metal. To prevent oxidation, the cap layer 150 may be deposited in situ, without removing the substrate 110 from the fabrication tool. In some embodiments, the resistive layer 140 and cap layer 150 may be formed in the same chamber of the tool. In other embodiments, the resistive layer 140 and cap layer 150 may be formed in respective chambers of a sealed cluster tool, with a robotic device transferring the substrate between chambers under vacuum or in an inert or reducing gas environment, to avoid contamination.

A conductive layer 160 is formed over the cap layer 150. The conductive layer 160 comprises a material that can withstand high temperatures and can be etched with high selectivity to the Ti or Ta containing layer. For example, conductive layer 160 may be a layer of CVD deposited tungsten (W) from about 500 angstroms to about 2500 angstroms in thickness. A material such as tungsten may be deposited ex situ in a different tool.

Figure 1B:
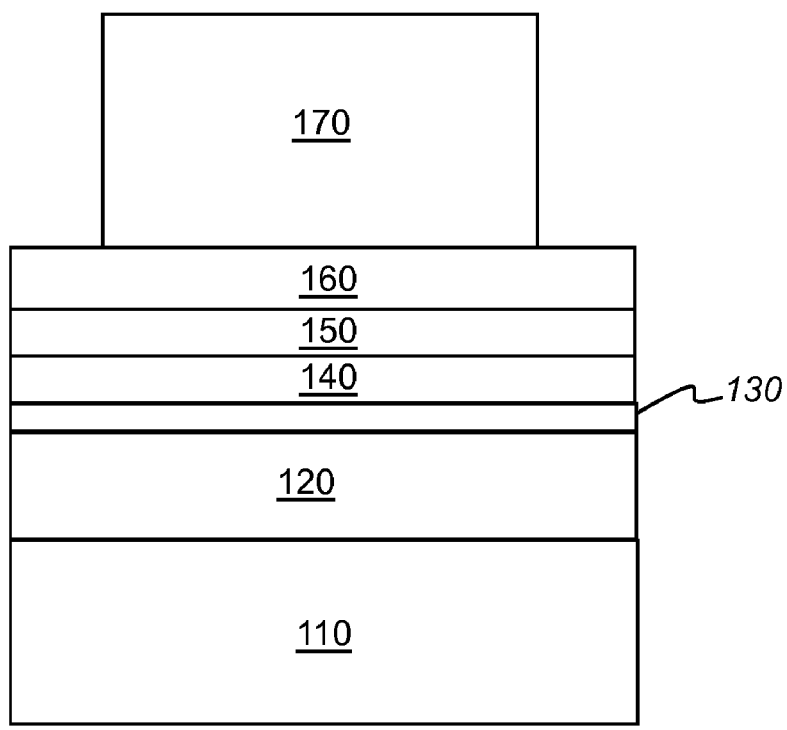

FIG. 1B shows formation of a first layer of photoresist 170 over the tungsten layer 160, for patterning the resistor 142 (shown in FIGS. 1E-1I). The exposed regions of the substrate are etched to remove the conductive layer 160, cap layer 150 and resistor material 140. Then the first photoresist layer 170 is removed.

Figure 1C:
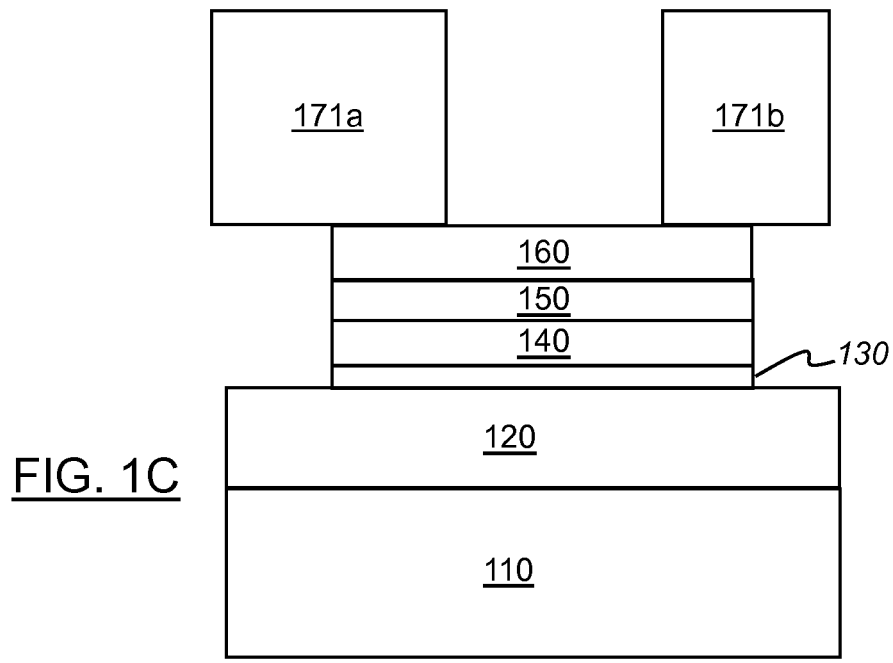

FIG. 1C shows the substrate 110 after the layers 140, 150 and 160 are removed from the outer regions (but retained in the region where the TFR 142 is to be formed). A second photoresist layer is deposited and patterned to form resist mask portions 171a, 171b, as shown in FIG. 1C.

Figure 1D:
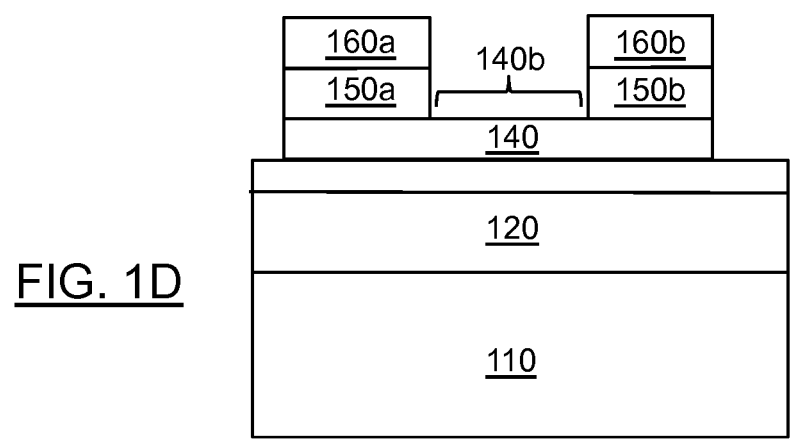

Referring to FIG. 1D, the substrate is patterned, to etch through the conductive layer 160 and cap layer 150, and stop on the underlying SiCr layer 140. Anisotropic etching (e.g., a dry etch) may be used, for example. The remaining resist layer portions 171a, 171b are stripped, and the substrate is selectively wet-etched in a solution that removes the exposed cap layer material 150, but does not affect the underlying SiCr layer 140. FIG. 1D shows the resulting structure, with the TFR body 140b connecting the contact heads 150a, 160a, 150b, 160b.

Figure 1E:
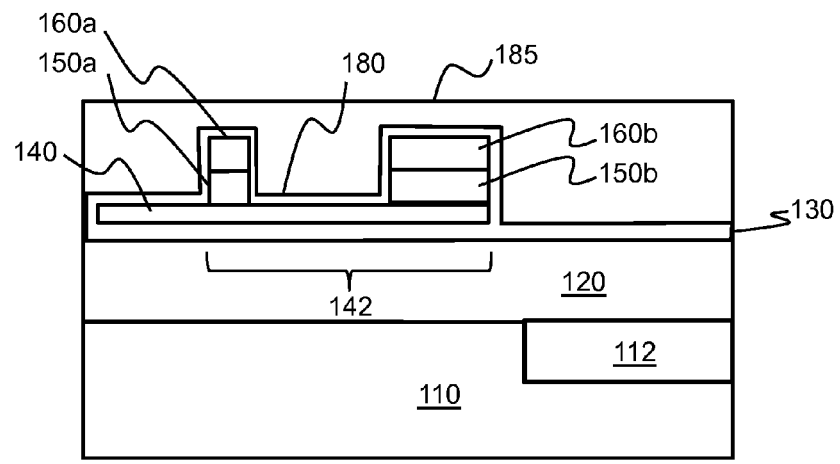

Referring to FIG. 1E, a conformal, high quality, low impurity oxide layer 180 is formed over the body 140b of TFR 142 and contact heads 160a, 160b. The oxide layer 180 may be formed by the same process used to form the oxide layer 130 (e.g., a silane-based process). The oxide layer 180 protects the TFR 142 from oxidation. The next ILD layer 185 is formed over the oxide layer 180. In some embodiments, the ILD layer 185 is planarized, so that the top surface of layer 185 is above the top of oxide layer 180. The resulting structure is shown in FIG. 1E. In the embodiment of FIG. 1E, the thickness of the ILD layer 185 is selected to match the ILD thickness of the other interconnect ILD layers, and is not dictated by the thickness of the TFR layers 140, 150, 160. Also shown in FIG. 1E is an additional portion of substrate 110, including the doped region 112 at its top surface. Doped region 112 is a representative example, and does not limit the number or location of doped regions in substrate 110.

In some embodiments, no annealing step is performed during the process steps shown in FIGS. 1A through 1E.

Figure 1F:
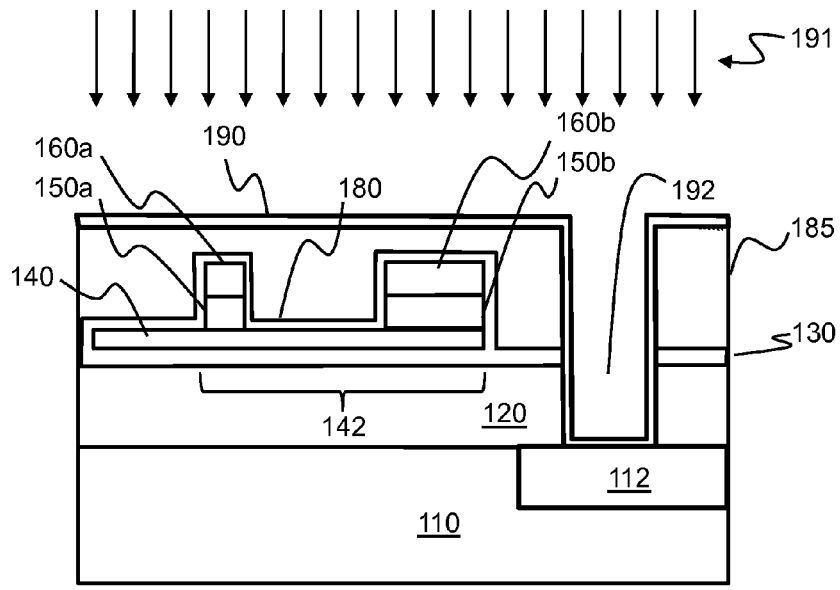

As shown in FIG. 1F, a contact hole 192 is formed in the dielectric layers 120, 185. The contact hole may be formed by anisotropic etching, such as reactive ion etching. The contact hole 192 exposes the doped region 112. A conformal conductive liner layer 190 (such as Ti, TiN or TaN, for example) is formed over the ILD layer 185, and lining the side and bottom walls of contact hole 192.

Following the formation of the liner layer 190, a rapid thermal anneal (RTA) step 191 is performed. Preferably, the RTA is performed on the thin film resistor and the conductive liner simultaneously. The annealing temperature may be in a range from about 500° C. to about 600° C. In some embodiments, the rapid thermal annealing raises a temperature of the thin film resistor to about 550° C. or hotter.

Figure 1G:
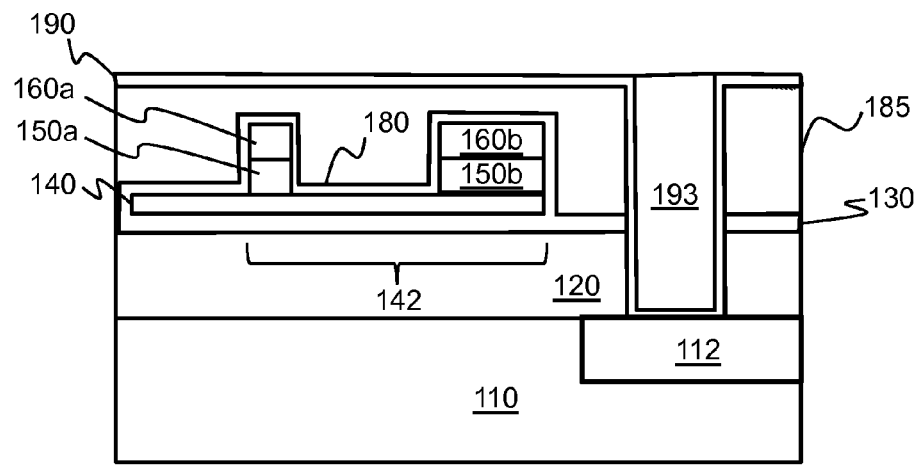
Figure 1H:
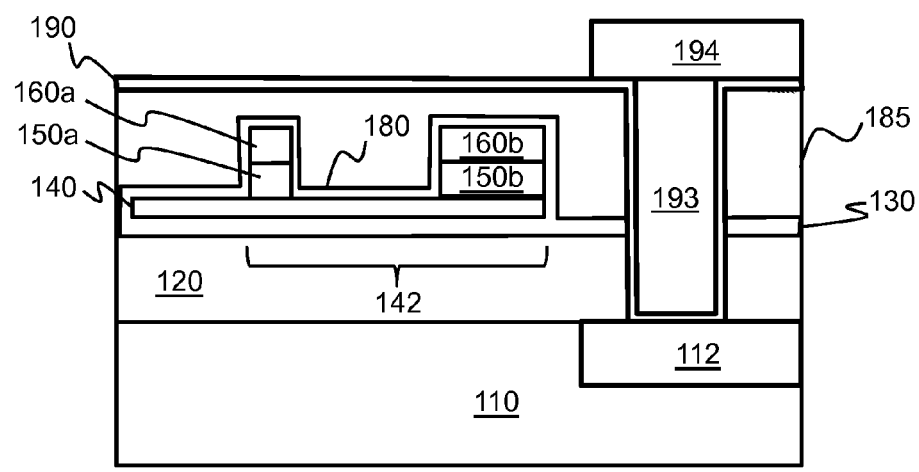

FIG. 1G shows the substrate 110 after a bulk fill step forms a conductive plug 193, of a material such as tungsten in the contact hole 192. The W plug 193 is then polished FIG. 1H shows a conductive contact 194 formed over the plug 193. The contact 193 may be formed of a metal such as aluminum.

Figure 1I:
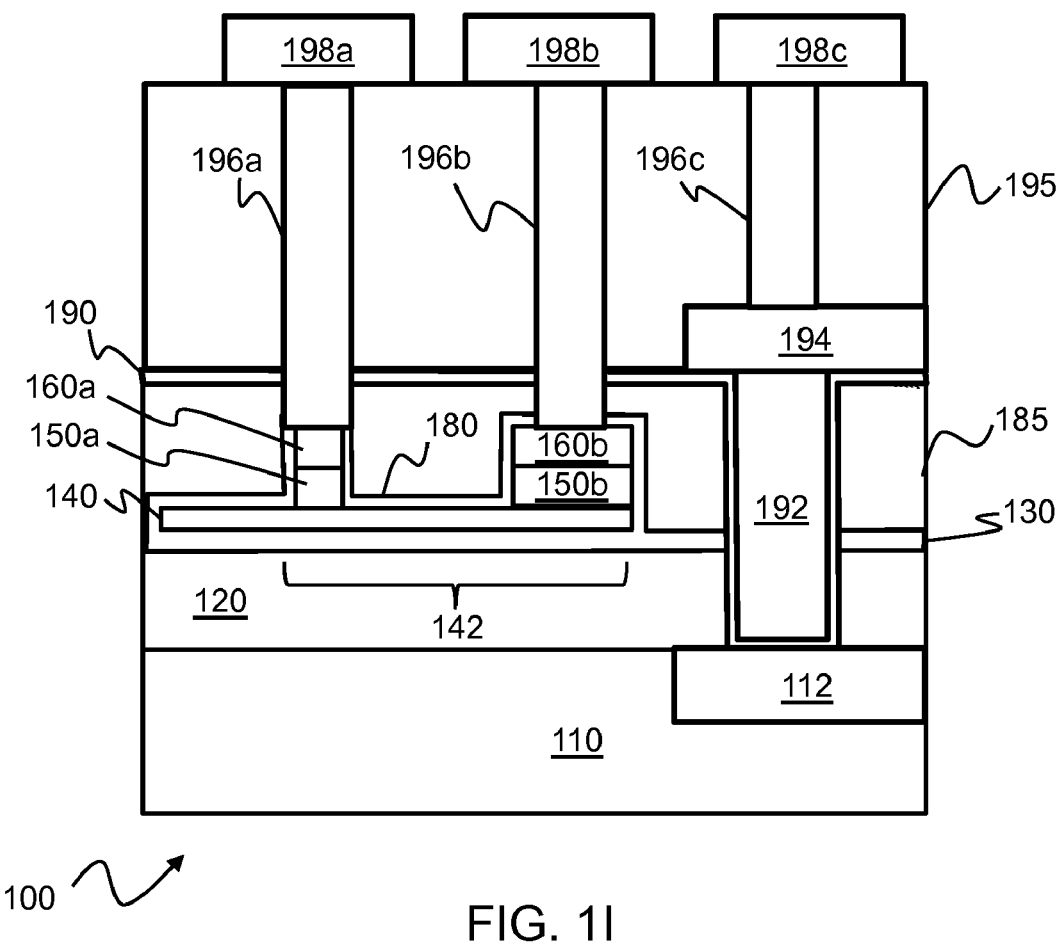

FIG. 1I shows the IC 100 after forming another IMD layer ($M_{T+1}$ layer) 195, planarizing the IMD layer 195, forming contact holes 196a-196c, filling the contact holes 196a-196c with conductive material, and forming contacts 198a-198c on the surface of IMD layer 195. The contacts 198a, 198b are thus connected to the resistor heads 160a, 160b of thin film resistor 142.

In the process shown in FIGS. 1A-1I, a single RTA step provides a desired thermal treatment for both the TFR 142 and the contact liner 190. The RTA step is designed to provide the thermal treatment to give the TFR 142 its target TCR and sheet resistance. One of ordinary skill in the art can readily select an appropriate RTA time and temperature to achieve a desired TCR and sheet resistance. Thus, the TCR and sheet resistance of the TFR 142 are not subjected to an undesired thermal treatment after the target TCR and sheet resistance are achieved. Further, the process time and complexity are reduced by elimination of an annealing step.

Although FIG. 1I shows a single ILD layer 195 above the ILD layer 185, any desired number of ILD layers may be provided above the layer 185, as appropriate for a given IC interconnect structure design.

Figure 2A:
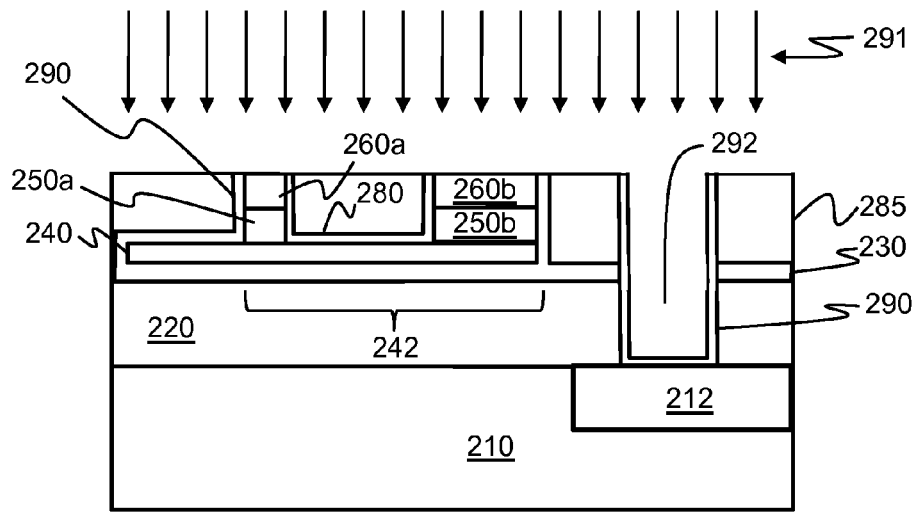
FIGS. 2A-2B show three steps that can be substituted in a variation of the method shown in FIGS. 1A-1I.
Figure 2B:
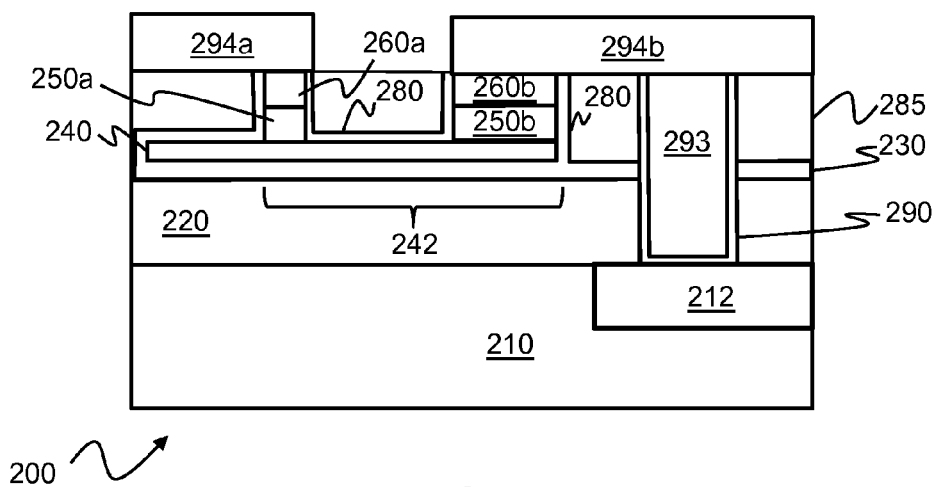

FIGS. 2A and 2B show a variation of the method of FIGS. 1A-1I. In this variation, the steps shown in FIGS. 1A-1E are performed to form a TFR 242 having the same structure as TFR 142, as described above. A description of these steps is not repeated. In FIGS. 2A and 2B, items which are the same as corresponding items in FIG. 1E are indicated by reference numerals increased by 100. Thus, the substrate 210, doped region 212, ILD 220, oxide 230, SiCr layer 240, resistor 242, glue layer 250a, 250b, conductive layer 260a, 260b, oxide layer 280, second ILD layer 285, liner 290, thermal treatment 291, and conductive via 293, can be the same as substrate 110, doped region 112, ILD 120, oxide 130 SiCr layer 140, resistor 142, glue layer 150a, 150b, conductive layer 160a, 160b, oxide layer 180, ILD layer 185, liner 190, thermal treatment 191, and conductive via 193, respectively. Descriptions of these individual elements are not repeated.

Following the deposition of the second ILD layer 285, the contact opening is formed above doped region 212, and a conformal conductive liner layer 290 is formed on the bottom and side walls of the contact opening 292. (The structure at this point is as shown in FIG. 1F, prior to the thermal treatment 191.) As shown in FIG. 2A, a subsequent planarization step removes all the material above the top of conductive layer 260a, 260b, including the material above the contact hole 292. The planarization may be performed using chemical mechanical polishing (CMP), for example. In this example, the thickness of the second ILD layer 285 after the planarization step may be different from the thickness of the ILD layer 220.

Then, as shown in FIG. 2A, a thermal treatment (e.g., RTA) 291 is performed to simultaneously give the TFR 242 a desired TCR and sheet resistance, and also anneal the liner 290, after the planarization. As in the case of FIGS. 1A to 1I, a single annealing step performs both of these functions, avoiding a second annealing step after the parameters of the TFR have already been adjusted by the thermal treatment 291.

In the configuration shown in FIG. 2A, planar conductive contacts 260a, 260b and 293 are already provided at the top surface of the structure. It is thus possible to form the metal contacts 294a and 294b (e.g., aluminum) directly over this structure, without forming an $M_{T+1}$ dielectric layer above ILD layer 285, as shown in FIG. 2B. Although FIG. 2B shows a single metal contact 294b connecting the conductive via 293 and the resistor contact 260b, in other embodiments, separate contacts may be provided above the resistor 242 and the doped region 212, similar to the use of separate contacts 198b and 198c in FIG. 1I.

Figure 3A:
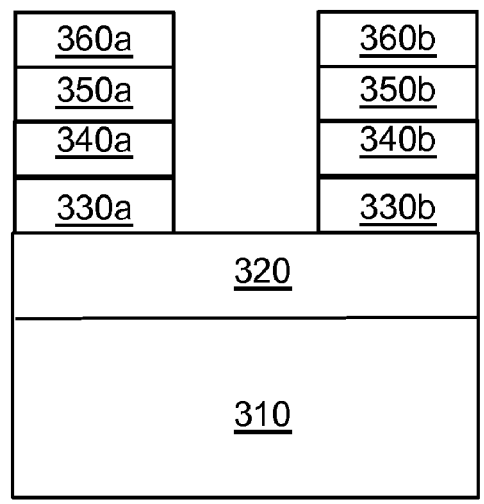
FIGS. 3A-3C alternative TFR formation steps that can be substituted in the method of FIG. 1A-1I or 2A-2B.
Figure 3B:
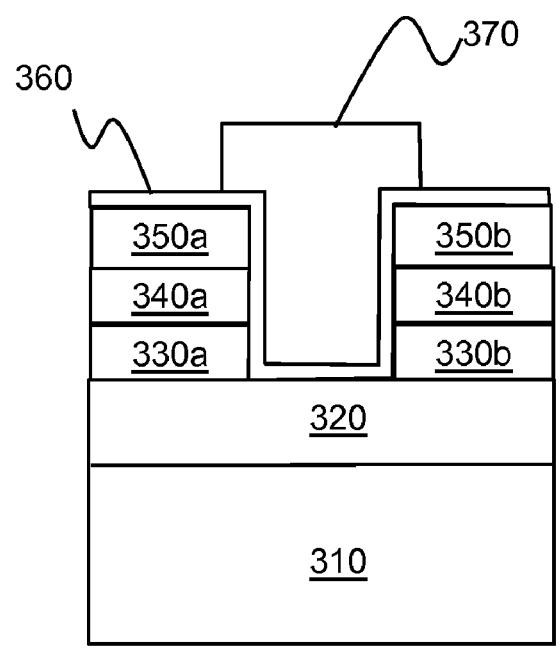
Figure 3C:
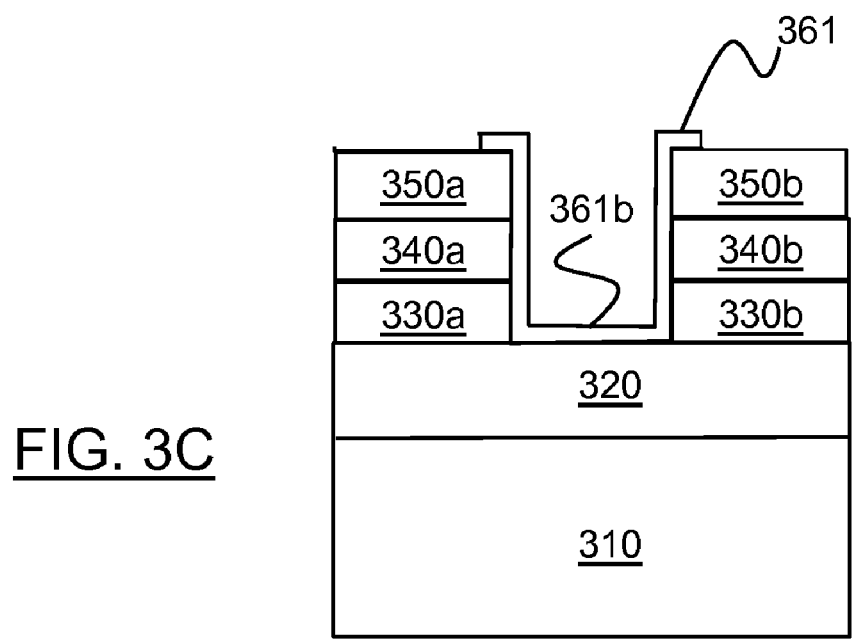

FIGS. 3A-3C show another alternative integration technique for forming a TFR, which can be substituted for the steps shown in FIGS. 1A-1D. Like the method described above with reference to FIGS. 1A-1D, two photomasks are used to form the TFR. Compared to the example of FIGS. 1A-1I or FIGS. 2A-2B, a different technique is used for forming the TFR, but the subsequent ILD deposition and annealing can be the same.

Referring to FIG. 3A, a stacked structure is provided, including the substrate 310, ILD layer 320, a conductive layer 330a, 330b (e.g., a layer of TiN, TaN, TiW, or TaW having a thickness of about 250 angstroms), a layer 340a, 340b of AlCu about 4000 angstroms thick, and a conductive layer 350a, 350b of TiN, TaN, TiW, or TaW about 400 Angstroms thick. (The second layer 350a, 350b of TiN is initially deposited with a thickness greater than the first layer 330a, 330b, to allow for some TiN removal during subsequent etching of the metal resistor.) A patterned photoresist mask 360a, 360b is formed over the conductive layer 350a, 350b. The substrate is etched to remove the exposed center portions of the TiN layers and the AlCu layer. The resulting structure is as shown in FIG. 3A.

FIG. 3B shows a second mask 370. The photoresist mask 360a, 360b of FIG. 3A is removed (e.g., by ashing). Then a conformal layer 360 is deposited, comprising a resistor material such as SiCr, Ni—Cr, Ta, Cr—SiO, or $Cr_xSi_yN_z$. A planar layer of photoresist material 370 is deposited over the substrate (e.g., by a spin-on technique). The photoresist 370 is exposed and developed, so that portions of the photoresist 370 can be removed above portions of the resistor material 360 to be removed, as shown in FIG. 3B.

Referring to FIG. 3C, the metal resistor portion 361 is formed by etching exposed portions of the resistor material 360. The etching may also remove some of the TiN material from layer 350a, 350b so that the remaining thickness of the TiN layer 350a, 350b is about 250 angstroms. The photoresist 370 is then removed (e.g., by ashing). The resulting structure is as shown in FIG. 3C. The resistance of the device is determined by the properties of the bottom portion 361b of the metal resistor portion.

Following formation of the TFR as shown in FIGS. 3A-3C, the remaining steps for completing the IC may be as described above with reference to either FIGS. 1E-1I, or as described above with reference to FIGS. 1E, 2A and 2B.

In one variation, the steps described above with respect to FIGS. 1E-1I are performed, including deposition of ILD 185, contact hole 192 formation, liner layer 190 deposition, annealing 191, via fill, ILD 195 formation, via 196a-196c formation, via fill, and contact 198a-198c formation. In this variation, the annealing 191 may be performed to raise the temperature of the substrate to a temperature from about 40° C. to about 50° C. for about 30 minutes.

In another variation, the steps described above with respect to FIGS. 1E, 2A and 2B are performed, including deposition of ILD 285, contact hole 292 formation, liner layer 290 deposition, planarization, annealing 291, via fill, and contact 294a, 294b formation. In this variation, the annealing 291 may be performed to raise the temperature of the substrate to a temperature from about 40° C. to about 50° C. for about 30 minutes.

Figure 4A:
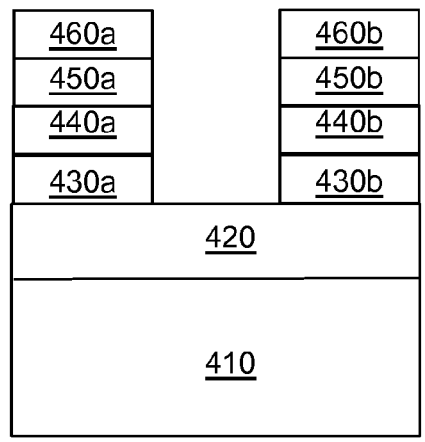
FIGS. 4A-4C show another alternative TFR formation steps that can be substituted in the method of FIG. 1A-1I or 2A-2B.
Figure 4B:
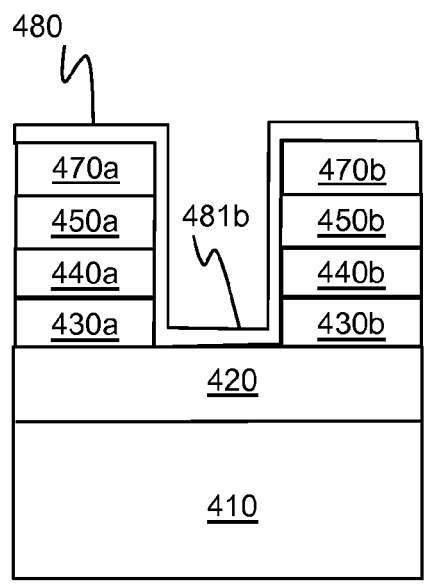
Figure 4C:
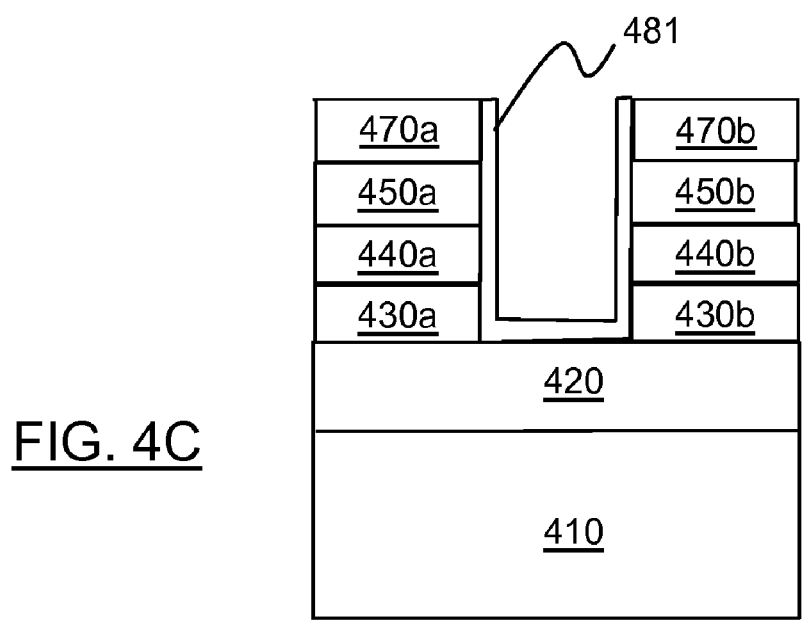

FIGS. 4A-4C show another integration technique for forming a TFR using only one mask for forming the TFR. Referring to FIG. 4A, a stacked structure is provided, including the substrate 410, ILD layer 420, a conductive layer 430a, 430b (e.g., a layer of TiN, TaN, TiW, or TaW having a thickness of about 250 angstroms), a layer 440a, 440b of AlCu about 4000 angstroms thick, and a conductive layer 450a, 450b of TiN, TaN, TiW, or TaW about 250 Angstroms thick. A patterned photoresist 460a, 460b is formed over the conductive layer 450a, 450b. The substrate is etched to remove the exposed center portions of the TiN layers and the AlCu layer. The resulting structure is as shown in FIG. 4A.

Referring to FIG. 4B, the mask 460a, 460b is removed, and an oxide layer 470a, 470b is formed on the TiN layer 450a, 450b. Then a conformal layer 480 of resistor material (such as SiCr, Ni—Cr, Ta, Cr—SiO, or $Cr_xSi_yN_z$) is deposited. The resulting structure is as shown in FIG. 4B.

Referring to FIG. 4C, the structure is then planarized (e.g., using CMP), to remove the portions of the resistor material 480 above the oxide layer 470a, 470b. The resistance of the device is determined by the properties of the bottom portion 481b of the metal resistor portion.

Following formation of the TFR as shown in FIGS. 4A-4C, the remaining steps for completing the IC may be as described above with reference to either FIGS. 1E-1I, or as described above with reference to FIGS. 1E, 2A and 2B.

In one variation, the steps described above with respect to FIGS. 1E-1I are performed, including deposition of ILD 185, contact hole 192 formation, liner layer 190 deposition, annealing 191, via fill, ILD 195 formation, via 196a-196c formation, via fill, and contact 198a-198c formation. In this variation, the annealing 191 may be performed to raise the temperature of the substrate to a temperature from about 40° C. to about 50° C. for about 30 minutes.

In another variation, the steps described above with respect to FIGS. 1E, 2A and 2B are performed, including deposition of ILD 285, contact hole 292 formation, liner layer 290 deposition, via fill, contact 294a, 294b formation, planarization, and annealing 291. In this variation, the annealing 291 may be performed to raise the temperature of the substrate to a temperature from about 40° C. to about 50° C. for about 30 minutes.

Thus, a variety of methods are described above for making a thin film resistor, comprising: forming a doped region in a semiconductor substrate; forming a dielectric layer over the substrate; forming a thin film resistor over the dielectric layer; forming a contact hole in the dielectric layer, wherein the contact hole exposes a portion of the doped region; and performing rapid thermal annealing to the thin film resistor after forming the contact hole. By omitting a separate TFR annealing step prior to forming the contact hole, the process time is reduced, and the adjusted properties of the TFR are not disturbed by a subsequent second annealing step.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method of making a thin film resistor, comprising:
   (a) forming a doped region in a semiconductor substrate;
   (b) forming a first dielectric layer over the substrate;
   (c) forming a thin film resistor having contacts over the first dielectric layer;
   (d) forming a second dielectric layer over the thin film resistor;
   (e) forming a contact hole in the first dielectric layer, wherein the contact hole exposes the doped region;
   (f) forming a conductive liner on a sidewall and bottom portion of the contact hole;
   (g) planarizing the second dielectric layer to expose contacts of the thin film resistor;
   (h) performing a rapid thermal annealing on the thin film resistor and the conductive liner simultaneously;
   (i) filling the contact hole with a conductive material; and
   (j) forming a conductive contact connecting one of the contacts of the thin film resistor with the conductive material in the contact hole.

2. The method of claim 1, wherein no annealing step is performed between steps (c) and (e).

3. The method according to claim 1, wherein the thin film resistor is not annealed until after step (e) is performed.

4. The method according to claim 3, wherein the thin film resistor is annealed a single time.

5. The method according to claim 1, wherein a thickness of the thin film resistor is about 200 Å or less.

6. The method according to claim 1, wherein the thin film resistor comprises a metal resistor.

7. The method according to claim 1, wherein the thin film resistor comprises SiCr.

8. The method according to claim 1, wherein the conductive liner comprises titanium nitride or tantalum nitride.

9. The method according to claim 1, wherein the rapid thermal annealing raises a temperature of the thin film resistor to about 550 degrees C. or hotter.

10. A method of making a thin film resistor, comprising:
    (a) forming a doped region in a semiconductor substrate;
    (b) forming a first dielectric layer over the substrate;
    (c) forming a thin film resistor having contacts over the first dielectric layer;
    (d) forming a second dielectric layer over the thin film resistor;
    (e) forming a contact hole in the first dielectric layer before annealing the thin film resistor, wherein the contact hole exposes a portion of the doped region;
    (f) forming a conductive liner on a sidewall and bottom portion of the contact hole;
    (g) planarizing the second dielectric layer to expose contacts of the thin film resistor;
    (h) performing rapid thermal annealing on the thin film resistor after forming the contact hole;
    (i) filling the contact hole with a conductive material; and
    (j) forming a conductive contact connecting one of the contacts of the thin film resistor with the conductive material in the contact hole.

11. The method of claim 10, wherein step (d) is performed after step (c), and no annealing step is performed on the thin film resistor between steps (c) and (e).

12. The method of claim 10, wherein step (d) is performed after step (c), and no annealing step is performed on the thin film resistor before step (e).

13. The method according to claim 10, wherein a thickness of the thin film resistor is about 200 Å or less.

14. The method according to claim 10, wherein the thin film resistor comprises a metal resistor.

15. The method according to claim 10, wherein the thin film resistor comprises SiCr.

16. The method according to claim 10, further comprising forming a conductive liner comprising titanium nitride or tantalum nitride after step (d), and step (e) includes simultaneously performing a rapid thermal annealing of the conductive liner and the thin film resistor.

17. The method according to claim 10, wherein the rapid thermal annealing raises a temperature of the thin film resistor to about 550 degrees C. or hotter.

* * * * *

UNITED STATES PATENT AND TRADEMARK OFFICE
CERTIFICATE OF CORRECTION

PATENT NO. : 8,080,461 B2  
APPLICATION NO. : 12/688083  
DATED : December 20, 2011  
INVENTOR(S) : Der-Chyang Yeh et al.

Page 1 of 1

It is certified that error appears in the above-identified patent and that said Letters Patent is hereby corrected as shown below:

Column 6, Lines 9-10, delete "40° C. to about 50° C." and replace with -- 400° C. to about 500° C. -- therefor.

Column 6, Line 17, delete "40° C. to about 50° C." and replace with -- 400° C. to about 500° C. -- therefor.

Column 6, Lines 51-52, delete "40° C. to about 50° C." and replace with -- 400° C. to about 500° C. -- therefor.

Column 6, Line 59, delete "40° C. to about 50° C." and replace with -- 400° C. to about 500° C. -- therefor.

Signed and Sealed this  
Nineteenth Day of June, 2012

David J. Kappos  
*Director of the United States Patent and Trademark Office*